[19] United States Patent
Stoufer

(10) Patent No.: US 10,423,231 B2
(45) Date of Patent: Sep. 24, 2019

(54) MINIATURE PRINTED CIRCUIT BOARD MOUNTED HAPTIC DEVICE

(71) Applicant: ELECTROLUX HOME PRODUCTS, INC., Charlotte, NC (US)

(72) Inventor: Paul Stoufer, Lincolnton, NC (US)

(73) Assignee: ELECTROLUX HOME PRODUCTS, INC., Charlotte, NC (US)

( * ) Notice: Subject to any disclaimer, the term of this patent is extended or adjusted under 35 U.S.C. 154(b) by 0 days.

(21) Appl. No.: 16/067,767

(22) PCT Filed: Jan. 12, 2017

(86) PCT No.: PCT/IB2017/050168
§ 371 (c)(1),
(2) Date: Jul. 2, 2018

(87) PCT Pub. No.: WO2017/122152
PCT Pub. Date: Jul. 20, 2017

(65) Prior Publication Data
US 2019/0050054 A1 Feb. 14, 2019

Related U.S. Application Data

(60) Provisional application No. 62/277,872, filed on Jan. 12, 2016.

(51) Int. Cl.
*G09G 5/08* (2006.01)
*G06F 3/01* (2006.01)
*H05K 1/16* (2006.01)
*H05K 1/18* (2006.01)
*G08B 6/00* (2006.01)

(52) U.S. Cl.
CPC ............. *G06F 3/016* (2013.01); *H05K 1/165* (2013.01); *H05K 1/181* (2013.01); *G08B 6/00* (2013.01);
(Continued)

(58) Field of Classification Search
CPC .......... G09G 5/08; F16K 31/00; F16K 31/04; G06F 3/16
(Continued)

(56) References Cited

U.S. PATENT DOCUMENTS 4,553,005 A * 11/1985 Glenn .................... H01H 9/061
200/241
5,701,828 A * 12/1997 Benore ............... E05B 47/0002
109/53

(Continued)

OTHER PUBLICATIONS

International Search Report dated Apr. 18, 2017 in International Application No. PCT/IB2017/050168 filed Jan. 12, 2017.

*Primary Examiner* — Xiaoliang Chen
(74) *Attorney, Agent, or Firm* — Womble Bond Dickinson (US) LLP

(57) ABSTRACT

An apparatus such as an appliance with a printed circuit board, PCB, (202) mounted haptic feedback device (200) is provided. The apparatus comprises a printed circuit board (PCB) having an opening (204) defined therein, and a spool (206) affixed to the PCB and having a shaft with a coil (208) wound thereabout. The shaft defines an opening aligned with the opening of the PCB. The apparatus also comprises a spring-loaded plunger positioned and movable within the opening of the shaft. The spring-loaded plunger includes a metallic disk operatively coupled to an end of the plunger and distally positioned to the spool. A control component of the apparatus is configured to energize the coil according to a haptic feedback pattern, and thereby cause the coil to attract the metallic disk and move the plunger within the opening of the shaft of the spool, and through the opening of the PCB.

12 Claims, 4 Drawing Sheets

(52) U.S. Cl.
CPC ............. *H05K 2201/09072* (2013.01); *H05K 2201/1003* (2013.01); *H05K 2201/1025* (2013.01); *H05K 2201/10083* (2013.01); *H05K 2201/10151* (2013.01); *H05K 2201/10265* (2013.01); *H05K 2201/10522* (2013.01)

(58) Field of Classification Search
USPC ................. 361/767; 345/163; 251/129.04; 318/114; 340/5.65, 407.1; 200/241, 522
See application file for complete search history.

(56) References Cited

U.S. PATENT DOCUMENTS

| | | | | |
|---|---|---|---|---|
| 2006/0044271 | A1* | 3/2006 | Anastas | G06F 3/016 |
| | | | | 345/163 |
| 2009/0309686 | A1* | 12/2009 | Espino | H01F 27/06 |
| | | | | 336/182 |
| 2012/0223824 | A1* | 9/2012 | Rothkopf | G06F 3/016 |
| | | | | 340/407.1 |
| 2012/0232780 | A1* | 9/2012 | Delson | A63F 13/06 |
| | | | | 701/400 |
| 2015/0081110 | A1* | 3/2015 | Houston | G05D 19/02 |
| | | | | 700/280 |
| 2015/0097129 | A1* | 4/2015 | Ben-Ami | F16K 31/004 |
| | | | | 251/129.04 |
| 2016/0144404 | A1* | 5/2016 | Houston | B06B 1/166 |
| | | | | 318/114 |
| 2016/0258758 | A1* | 9/2016 | Houston | G01C 21/20 |

* cited by examiner

MINIATURE PRINTED CIRCUIT BOARD MOUNTED HAPTIC DEVICE

CROSS-REFERENCE TO RELATED APPLICATION

The present application claims priority to U.S. Provisional Patent Application No. 62/277,872, entitled: Miniature Printed Circuit Board Mounted Haptic Device filed on Jan. 12, 2016, the content of which is incorporated herein by reference.

TECHNOLOGICAL FIELD

The present disclosure relates generally to appliances and, in particular, to a miniature printed circuit board (PCB) mounted haptic device for an appliance.

BACKGROUND

Modern appliances may include appropriate components that provide for controlling and/or operating the appliance. Certain appliances may include a control unit in communication with one or more user interfaces or other control elements. In some instances, the user interface may include various configurations of actuatable elements for permitting user selection from among a plurality of options associated with the appliance. For example, a rotational-selection knob may be provided on a control panel of a laundry appliance, wherein the user rotates the selection knob to the desired laundry cycle or cycle segment, and then actuates an actuator to initiate the laundry cycle. In some instances, another physical button or knob may be provided for altering one or more of the default settings associated with the appliance.

Although most existing user interface elements are adequate to allow user selection of options associated with an appliance, it is generally desirable to provide an improved user interface elements or mechanisms that may be useful with the same.

BRIEF SUMMARY

Example implementations of the present disclosure are directed to an improved apparatus for providing haptic feedback such as providing haptic feedback at an appliance. The present disclosure includes, without limitation, the following example implementations.

Example Implementation 1

An apparatus comprising a printed circuit board (PCB) having an opening defined therein; a spool affixed to the PCB and having a shaft with a coil wound thereabout, the shaft defining an opening aligned with the opening of the PCB; a spring-loaded plunger positioned and movable within the opening of the shaft, the spring-loaded plunger including a metallic disk operatively coupled to an end of the plunger and distally positioned to the spool; and a control component configured to energize the coil according to a haptic feedback pattern using a voltage output, and thereby cause the coil to attract the metallic disk and move the plunger within the opening of the shaft of the spool, and through the opening of the PCB, according to the haptic feedback pattern, wherein a rate of change of the plunger is proportional to the voltage output.

Example Implementation 2

The apparatus of any preceding or any subsequent example implementation, or any combination thereof, wherein the apparatus further comprises at least two metal tabs secured to the spool and soldered to the PCB to thereby secure the spool to the PCB.

Example Implementation 3

The apparatus of any preceding or any subsequent example implementation, or any combination thereof, wherein an outer diameter of the coil is less than or equal to 0.25 inches.

Example Implementation 4

The apparatus of any preceding or any subsequent example implementation, or any combination thereof, wherein the spring-loaded plunger is formed of a non-ferrous material.

Example Implementation 5

The apparatus of any preceding or any subsequent example implementation, or any combination thereof, wherein the spring-loaded plunger defines a groove proximate an end of the plunger opposite the end to which the metallic disk is operatively coupled, the apparatus further comprising a retaining ring installed in the groove to hold the plunger within the opening of the shaft.

Example Implementation 6

The apparatus of any preceding or any subsequent example implementation, or any combination thereof, wherein the haptic feedback pattern is selectable from a plurality of haptic feedback patterns having varying frequencies, durations or power switching sequences.

Example Implementation 7

An appliance comprising a plurality of components configured to perform one or more cleaning, cooking or environmental control operations of the appliance; and a user interface configured to enable user control of the one or more cleaning, cooking or environmental control operations, the user interface including a haptic feedback device comprising: a printed circuit board (PCB) having an opening defined therein; a coil trace pattern printed on the PCB or a coil affixed to the PCB and forming a cylindrical shape, the shaft thereof defining an opening aligned with the opening of the PCB; a spring-loaded plunger positioned and movable within the opening of the PCB or the shaft, the spring-loaded plunger including a metallic disk operatively coupled to an end of the plunger and distally positioned to the opening; and a control component configured to energize the coil trace pattern or the coil according to a haptic feedback pattern using a voltage output, and thereby cause the coil trace pattern or the coil to attract the metallic disk and move the plunger through the opening of the PCB or the shaft of the coil, according to the haptic feedback pattern, wherein a rate of change of the plunger is proportional to the voltage output.

Example Implementation 8

The appliance of any preceding or any subsequent example implementation, or any combination thereof, wherein the haptic feedback device includes the coil and further includes at least two metal tabs secured to the coil and soldered to the PCB to thereby secure the coil to the PCB.

Example Implementation 9

The appliance of any preceding or any subsequent example implementation, or any combination thereof, wherein the haptic feedback device includes the coil and an outer diameter of the coil is less than or equal to 0.25 inches.

Example Implementation 10

The appliance of any preceding or any subsequent example implementation, or any combination thereof, wherein the spring-loaded plunger is formed of a non-ferrous material.

Example Implementation 11

The appliance of any preceding or any subsequent example implementation, or any combination thereof, wherein the spring-loaded plunger defines a groove proximate an end of the plunger opposite the end to which the metallic disk is operatively coupled, the appliance further comprising a retaining ring installed in the groove to hold the plunger within the opening of the shaft.

Example Implementation 12

The appliance of any preceding or any subsequent example implementation, or any combination thereof, wherein the haptic feedback pattern is selectable from a plurality of haptic feedback patterns having varying frequencies, durations or power switching sequences.

These and other features, aspects, and advantages of the present disclosure will be apparent from a reading of the following detailed description together with the accompanying drawings, which are briefly described below. The present disclosure includes any combination of two, three, four, or more features or elements set forth in this disclosure, regardless of whether such features or elements are expressly combined or otherwise recited in a specific implementation description herein. This disclosure is intended to be read holistically such that any separable features or elements of the disclosure, in any of its aspects and implementations, should be viewed as combinable, unless the context of the disclosure clearly dictates otherwise.

It will therefore be appreciated that the above Summary is provided merely for purposes of summarizing some example implementations so as to provide a basic understanding of some aspects of the disclosure. As such, it will be appreciated that the above described example implementations are merely examples of some implementations and should not be construed to narrow the scope or spirit of the disclosure in any way. It will be appreciated that the scope of the disclosure encompasses many potential implementations, some of which will be further described below, in addition to those here summarized. Further, other aspects and advantages of implementations disclosed herein will become apparent from the following detailed description taken in conjunction with the accompanying drawings which illustrate, by way of example, the principles of the described implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
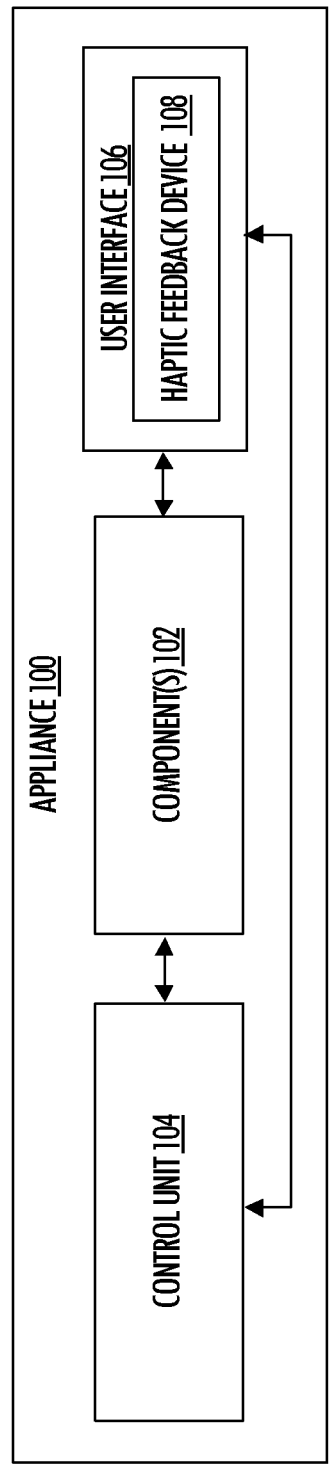
FIG. 1 is an illustration of an appliance according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like. Unless otherwise stated, any one or more if not all of these may be absolute or approximate to account for acceptable variations that may occur, such as those due to engineering tolerances or the like. Like reference numerals refer to like elements throughout.

Example implementations of the present disclosure are generally directed to a printed circuit board (PCB) mounted haptic feedback device for an apparatus. The haptic feedback device may be surface-mounted to the apparatus or a user interface of the apparatus and include a plunger that moves through the PCB to strike the apparatus/user interface and thereby provide haptic feedback. The haptic feedback device may be suitable for any of a number of different apparatuses including any of a number of different appliances.

FIG. 1 illustrates an appliance 100 according to example implementations of the present disclosure. The appliance may be any of a number of different types of appliances, such as any of a number of different types of major appliances (white goods), small appliances and the like. Examples of suitable appliances include dishwashers, washing machines, clothes dryers, refrigerators, freezers, ovens, ranges, cooktops, microwave ovens, trash compactors, air conditioners, vacuum cleaners, water heaters or the like.

As shown, the appliance 100 may include a plurality of components 102 generally configured to perform cleaning, cooking or environmental control operations. The type and number of the components of the appliance may depend on the particular appliance, but may include pumps, valves, motors, heating elements and the like. For example, the components of a kitchen oven, range or food warmer may include one or more heating elements for heating a chamber of the appliance that may be accessible by a door, and one or more temperature sensors for measuring the temperature within the chamber. As another example, a laundry appliance (e.g., a washing or drying machine) may include a tub portion, supported within a housing, in which laundry may be placed for washing and/or drying. A washing or drying drum may be rotatably disposed within the tub portion of the respective washing and drying appliance for agitating or spinning the laundry during the washing or drying process. In another example, an environmental-control appliance such as a refrigerator, freezer, or air conditioner may include components configured to regulate temperature within a compartment of the appliance or another defined space within which the appliance is installed (e.g., one or more rooms of a building).

Figure 5:
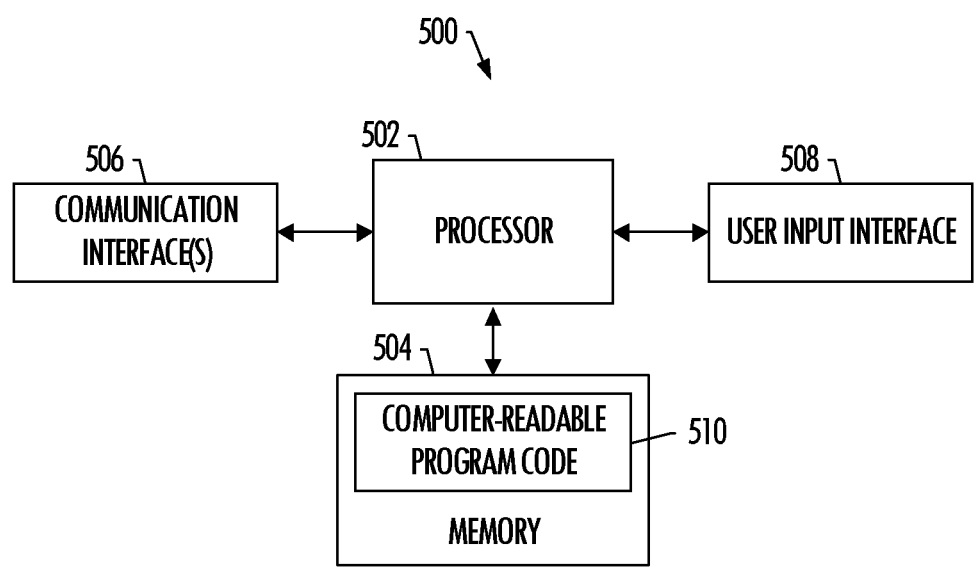
FIG. 5 illustrates a control unit according to various example implementations.

According to example implementations, at least some components 102 of the appliance 100 may be configured to operate under direct control of a control unit 104 and/or a user interface 106. While the user interface may effect direct control of the components, the user interface 106 may, in some implementations, be further coupled to the control unit and also configured to operate under control of the control unit to thereby effect control of the components. The control unit includes a number of electronic components such as a microprocessor or processor core, and a memory. In some examples, as shown in FIG. 5, the control unit 500 may include a microcontroller with integrated processor core 502 and memory 504, and may further include one or more integrated input/output peripherals 506, 508.

The user interface 106 may receive user input and in some examples provide an audible, visual, mechanical, or other output to a user. The user interface may include a control knob, joystick, keypad, keyboard, display, touch screen display, microphone, speaker, biometric input device, and/or other input/output mechanism. In some example implementations, the user interface may include a number of other components such as a haptic feedback device 108 configured to provide tactile feedback to a user of the appliance 100. For example, for a rotary input (e.g., a knob) multiple haptic feedback patterns may be provided for angular positions of the knob to indicate changes in settings. In another example, upon pressing a button such as a capacitive touch button, a mechanical vibration or "tap" pattern may be produced such that the user feels that the input was accepted, or conversely a successive "tap" pattern may be produced to indicate an invalid selection.

It should be noted that while the example implementations herein illustrate the user interface 106 and haptic feedback device 108 within an appliance, in other example implementations, the user interface and haptic feedback device are suitable for use with other devices or machinery having user actuatable elements such as knobs, or capacitive or other touch sensitive surfaces in which the input mechanisms of the device (e.g., a button) does not produce a mechanical feedback. Suitable devices may include automated teller machines (ATM), kiosks, parking garage terminals, automotive dash controls and the like.

In one particular example, the user interface 106 may include a small PCB mounted pushbutton (e.g., an industrial pushbutton switch) which is formed of a hard material (e.g., plastic) and includes a depressible section that upon being pressed results in a haptic feedback at the fingertip of the user. For instance, the pushbutton may cause a machine member to move such that pressing and holding the button results in the haptic feedback device 108 providing a short, intermittent vibration of "ticking" feedback while the machine member is moving and then a long, strong vibration or "buzzing" feedback when the member has reached the end of movement. In another instance, the pushbutton may adjust a value (e.g., temperature) such that upon holding the pushbutton the value will adjust with respect to a steadily increasing rate the longer the button is held. In this instance, the haptic feedback device may provide a small vibration at each five degree increment, for example, which allows the user to see and feel the incremental changes in the value, and the speed of change.

Figure 2:
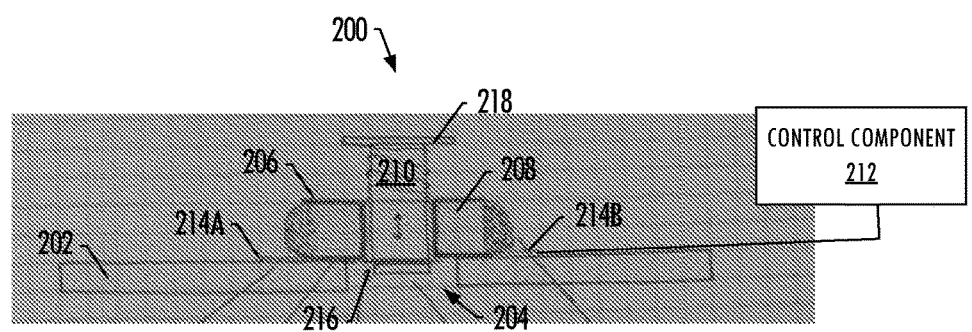
FIG. 2 is an illustration of a printed circuit board (PCB) mounted haptic feedback device, according to example implementations of the present disclosure.

FIG. 2 illustrates a suitable haptic feedback device 200 that may correspond to the haptic feedback device 108 of FIG. 1. As shown, the haptic feedback device may be mounted onto a printed circuit board (PCB) 202 that has an opening 204 defined therein. The haptic feedback device includes a spool 206, coil 208, spring-loaded plunger 210, control component 212, metal tabs 214A, 214B, and a retaining ring 216. The opening within the PCB and below the spool allows clearance for the plunger to move through the PCB for providing the haptic feedback. In some implementations, the haptic feedback device is mounted to an appliance, and thereby configured to provide haptic feedback at the appliance. In some alternative implementations, the haptic feedback device may exclude the spool and instead include a coil trace pattern printed on the PCB or a coil affixed to the PCB and forming a cylindrical shape, the shaft thereof defining an opening aligned with the opening of the PCB. In some examples, the haptic device is mounted to the user interface panel near the user actuatable element (e.g., a button, knob, slider or other control element) that is also mounted to the PCB along with other user interface components (e.g., input switches, light emitting diodes (LED), displays, buzzers, and the like)

Figure 3A:
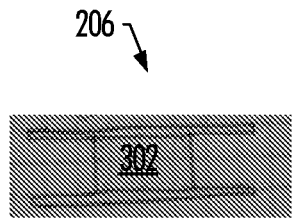
FIGS. 3A, 3B and 4 illustrate various components of the PCB mounted feedback device of FIG. 2, according to various example implementations.
Figure 3B:
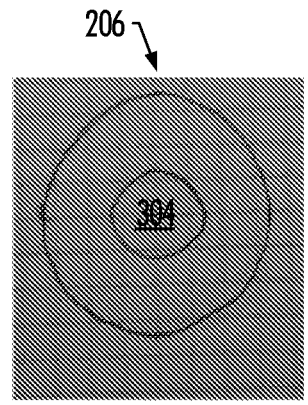

As shown, the spool 206 is affixed to the PCB 202. In some examples, the at least two metal tabs metal tabs 214A, 214B are secured to the spool and soldered to the PCB to thereby secure the spool to the PCB. As shown more particularly in FIGS. 3A and 3B, the spool has a shaft 302 around which the coil 208 is wound, and the shaft defines an opening 304 that is aligned with the opening 204 of the PCB to enable movement of the spring-loaded plunger within the openings. The coil may be or include a substantially small toroidal coil, which in some examples may have an outer diameter less than or equal to 0.25 inches.

Figure 4:
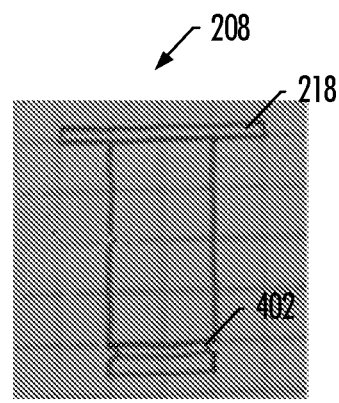

As also shown in FIG. 2, in some examples, the spring-loaded plunger 210 includes a metallic disk 218 operatively coupled to an end of the plunger and distally positioned to the spool 206. That is, the metallic disk may be held away from the spool with a spring. In some examples, the spring-loaded plunger is formed of a non-ferrous material such as plastic. As shown more particularly in FIG. 4, in some example implementations, the spring-loaded plunger defines a groove 402 proximate an end of the plunger opposite the end to which the metallic disk is operatively coupled. In these examples, the retaining ring 216 is installed in the groove to hold the plunger within the opening of the shaft. One example of a suitable retaining ring is a circlip that may be snapped into place into the groove of the spring-loaded plunger.

Returning to FIG. 2, similar to the control unit 104 of the appliance 100, the control component of the haptic feedback device 200 includes a number of electronic components such as a microprocessor or processor core, and a memory. In some examples, the control component may include a microcontroller with integrated processor core and memory, and may further include one or more integrated input/output peripherals. Further, in some examples, the control component may include a driver to regulate current flow.

In accordance with example implementations of the present disclosure, the control component 212, which may be mounted to the PCB, is configured to energize the coil 208 according to a haptic feedback pattern using a voltage output, and thereby cause the coil to attract the metallic disk 218 and move the plunger within the opening 304 of the shaft 302 of the spool 206, and through the opening 204 of the PCB 202, according to the haptic feedback pattern such that it strikes the rear of the user interface panel to which the PCB is mounted. The rate of change of the plunger is proportional to the voltage output such that the amount of power applied to the coil determines the force with which the plunger strikes the user interface panel allowing the force to be programmable (e.g., soft to harsh). That is, the voltage applied to the coil will determine a speed of travel of the plunger, to thereby affect the impact of the plunger and adjust the fee; of the haptic feedback. In some implementations. The haptic feedback pattern is selectable from a plurality of haptic feedback patterns that have varying frequencies, durations or power switching sequences.

According to example implementations of the present disclosure, the control unit 500 (e.g., control unit 104) and its respective components may be implemented by various means. Examples of suitable means include hardware, alone or under direction of one or more computer program code instructions, program instructions or executable computer-readable program code instructions 510 from a computer-readable storage medium.

Many modifications and other implementations of the disclosure set forth herein will come to mind to one skilled in the art to which these disclosure pertain having the benefit of the teachings presented in the foregoing descriptions and the associated drawings. Therefore, it is to be understood that the disclosure are not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus comprising:
  a printed circuit board (PCB) having an opening defined therein;
  a spool affixed to the PCB and having a shaft with a coil wound thereabout, the shaft defining an opening aligned with the opening of the PCB;
  a spring-loaded plunger positioned and movable within the opening of the shaft, the spring-loaded plunger including a metallic disk operatively coupled to an end of the plunger and distally positioned to the spool; and
  a control component configured to energize the coil according to a haptic feedback pattern using a voltage output, and thereby cause the coil to attract the metallic disk and move the plunger within the opening of the shaft of the spool, and through the opening of the PCB, according to the haptic feedback pattern, wherein a rate of change of the plunger is proportional to the voltage output.

2. The apparatus of claim 1 further comprising at least two metal tabs secured to the spool and soldered to the PCB to thereby secure the spool to the PCB.

3. The apparatus of claim 1, wherein an outer diameter of the coil is less than or equal to 0.25 inches.

4. The apparatus of claim 1, wherein the spring-loaded plunger is formed of a non-ferrous material.

5. The apparatus of claim 1, wherein the spring-loaded plunger defines a groove proximate an end of the plunger opposite the end to which the metallic disk is operatively coupled, the apparatus further comprising a retaining ring installed in the groove to hold the plunger within the opening of the shaft.

6. The apparatus of claim 1, wherein the haptic feedback pattern is selectable from a plurality of haptic feedback patterns having varying frequencies, durations or power switching sequences.

7. An appliance comprising:
  a plurality of components configured to perform one or more cleaning, cooking or environmental control operations of the appliance; and
  a user interface configured to enable user control of the one or more cleaning, cooking or environmental control operations, the user interface including a haptic feedback device comprising:
    a printed circuit board (PCB) having an opening defined therein;
    a coil trace pattern printed on the PCB or a coil affixed to the PCB and forming a cylindrical shape, the shaft thereof defining an opening aligned with the opening of the PCB;
    a spring-loaded plunger positioned and movable within the opening of the PCB or the shaft, the spring-loaded plunger including a metallic disk operatively coupled to an end of the plunger and distally positioned to the opening; and
    a control component configured to energize the coil trace pattern or the coil according to a haptic feedback pattern using a voltage output, and thereby cause the coil trace pattern or the coil to attract the metallic disk and move the plunger through the opening of the PCB or the shaft of the coil, according to the haptic feedback pattern, wherein a rate of change of the plunger is proportional to the voltage output.

8. The appliance of claim 7, wherein the haptic feedback device includes the coil and further includes at least two metal tabs secured to the coil and soldered to the PCB to thereby secure the coil to the PCB.

9. The appliance of claim 7, wherein the haptic feedback device includes the coil and an outer diameter of the coil is less than or equal to 0.25 inches.

10. The appliance of claim 7, wherein the spring-loaded plunger is formed of a non-ferrous material.

11. The appliance of claim 7, wherein the spring-loaded plunger defines a groove proximate an end of the plunger opposite the end to which the metallic disk is operatively coupled, the appliance further comprising a retaining ring installed in the groove to hold the plunger within the opening of the shaft.

12. The appliance of claim 7, wherein the haptic feedback pattern is selectable from a plurality of haptic feedback patterns having varying frequencies, durations or power switching sequences.

* * * * *